United States Patent
Ma et al.

(10) Patent No.: US 9,955,087 B1
(45) Date of Patent: Apr. 24, 2018

(54) HYDROGEN-DOPED GERMANIUM NANOMEMBRANES

(71) Applicant: WISCONSIN ALUMNI RESEARCH FOUNDATION, Madison, WI (US)

(72) Inventors: Zhenqiang Ma, Middleton, WI (US); Munho Kim, Champaign, IL (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/395,905

(22) Filed: Dec. 30, 2016

(51) Int. Cl.
*H01L 21/00* (2006.01)
*H04N 5/33* (2006.01)
*H01L 31/0288* (2006.01)
*H01L 31/18* (2006.01)
*H01L 31/0224* (2006.01)
*G02B 6/122* (2006.01)
*G02B 6/12* (2006.01)

(52) U.S. Cl.
CPC ............... *H04N 5/33* (2013.01); *G02B 6/122* (2013.01); *H01L 31/0288* (2013.01); *H01L 31/022408* (2013.01); *H01L 31/1808* (2013.01); *G02B 2006/12061* (2013.01); *G02B 2006/12138* (2013.01)

(58) Field of Classification Search
None
See application file for complete search history.

(56) References Cited

U.S. PATENT DOCUMENTS

| 6,335,266 B1 | 1/2002 | Kitahara et al. |
| 7,247,545 B2 | 7/2007 | Maa et al. |
| 2006/0194415 A1 | 8/2006 | Lee et al. |
| 2008/0311696 A1* | 12/2008 | Chee-Wee ............ H01L 21/187 438/57 |

OTHER PUBLICATIONS

Zavada et al., Hydrogen depth profiles and optical characterization of annealed, proton-implanted n-type GaAs, Journal of Applied Physics 58; doi: 10.1063/1.335637, 1985, pp. 3731-3734.
Chen et al., High performance germanium photodetectors integrated on submicron silicon waveguides by low temperature wafer bonding, Optics Express, vol. 16, No. 15, Jul. 17, 2008, pp. 11513-11518.
Chen et al., Ultra-low capacitance and high speed germanium photodetectors on silicon, Optics Express, vol. 17, No. 10, Apr. 28, 2009, pp. 7901-7906.
Dosunmu et al., Resonant Cavity Enhanced Ge Photodetectors for 1550 nm Operation on Reflecting Si Substrates, IEEE Journal of Selected Topics in Quantum Electronics, Vol. 10, No. 4, Jul. 2004, pp. 694-701.

(Continued)

*Primary Examiner* — Reema Patel
(74) *Attorney, Agent, or Firm* — Bell & Manning, LLC

(57) ABSTRACT

Photodetectors based on hydrogen-doped, single-crystalline germanium, including waveguide integrated photodetectors for photonic chip applications are provided. Hydrogen doping provides the single-crystalline germanium with increased radiation absorption in the near infrared region of the electromagnetic spectrum, including at wavelengths of 1550 nm and above.

22 Claims, 14 Drawing Sheets

(56) References Cited

OTHER PUBLICATIONS

Wang et al., Ge-Photodetectors for Si-Based Optoelectronic Integration, Sensors, 11; doi:10.3390/s110100696, Jan. 12, 2011, pp. 696-718.
Kim et al., Flexible germanium nanomembrane metal-semiconductor-metal photodiodes, Applied Physics Letters 109, 051105; doi: 10.1063/1.4960460, Aug. 2, 2016.
Liu et al., Tensile strained Ge p-i-n photodetectors on Si platform for C and L band telecommunications, Applied Physics Letters 87, 011110; doi: 10.1063/1.1993749, Jul. 1, 2005.
Yuan et al., Flexible photodetectors on plastic substrates by use of printing transferred single-crystal germanium membranes, Applied Physics Letters 94, 013102, Jan. 6, 2009.
Liu et al., Direct-gap optical gain of Ge on Si at room temperature, Optics Letters, vol. 34, No. 11, May 29, 2009, pp. 1738-1740.
Chao et al., Characteristics of Germanium-on-Insulators Fabricated by Wafer Bonding and Hydrogen-Induced Layer Splitting, Japanese Journal of Applied Physics, vol. 45, No. 11, Nov. 8, 2006, pp. 8565-8570.

\* cited by examiner

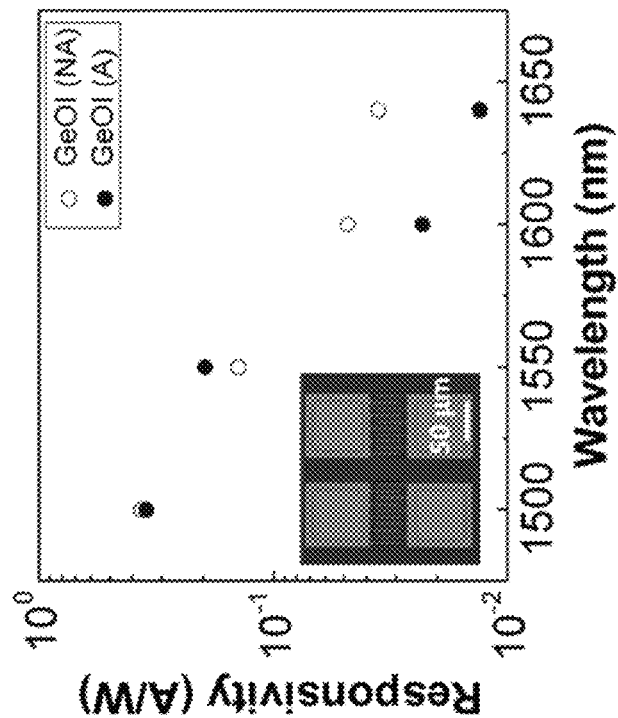
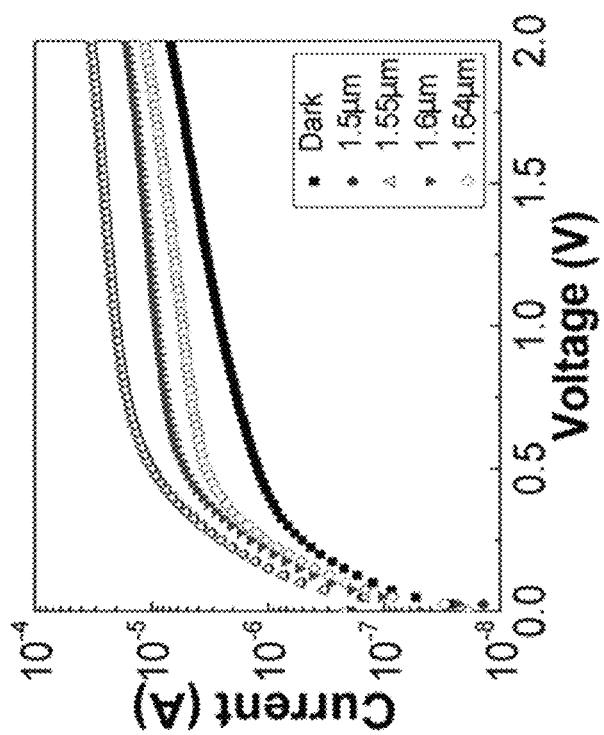
FIG. 11(A)
FIG. 11(B)

HYDROGEN-DOPED GERMANIUM NANOMEMBRANES

REFERENCE TO GOVERNMENT RIGHTS

This invention was made with government support under FA9550-09-1-0482 awarded by the USAF/AFOSR. The government has certain rights in the invention.

BACKGROUND

Germanium (Ge) is a key semiconductor material in photonic and optoelectronic applications due to its superior light absorption properties in the near-infrared (NIR) wavelength range. Wavelengths beyond 1.55 µm are especially important because the wavelength range for dense wavelength division multiplexing (DWDM) technology expands to the L-band (i.e., 1561~1620 nm). However, Ge photodetectors typically suffer from low responsivity at wavelengths longer than 1.55 µm due to the abrupt drop in their absorption coefficient beginning at a wavelength of ~1.5 µm.

Ge nanomembranes (Ge NM), which may have, for example, thicknesses ranging from several tens of nanometers to hundreds of nanometers, have been used in optoelectronic applications. For example, Ge-based infrared optical gain media and flexible Ge photodetectors have been demonstrated. Although a thicker (i.e., bulk) Ge layer has the advantage of better light absorption, a thinner Ge layer (e.g., Ge NM) has more flexibility for device fabrication. Regardless of the thickness, the light absorption coefficient for Ge (both bulk Ge and Ge NM) decreases rapidly at wavelengths longer than 1.5 µm. Therefore, it is desirable to enhance the light absorption coefficient of Ge so that the total light absorption can be enhanced sufficiently to enable its use in Ge-based optical sensor applications for both long haul and on-chip optical communications.

SUMMARY

Photodetectors based on hydrogen-doped, single-crystalline germanium, including waveguide integrated photodetectors for photonic chip applications are provided. Also provided are methods for using the photodetectors to convert an optical signal into and electric signal.

Photodetectors based on hydrogen-doped, single-crystalline germanium, including waveguide integrated photodetectors for photonic chip applications are provided. Also provided are methods for using the photodetectors and methods for fabricating the photodetectors.

An embodiment of a photodetector comprises: a layer of hydrogen-doped, single-crystalline germanium having a hydrogen dopant concentration of at least $1 \times 10^{18}$ atoms/cm$^3$ throughout its thickness; a first electrode in electrical communication with the layer of hydrogen-doped, single-crystalline germanium; and a second electrode in electrical communication with the layer of hydrogen-doped, single-crystalline germanium.

An embodiment of a photodetector comprises: a layer of hydrogen-doped, single-crystalline germanium having an absorption coefficient of at least 100 cm$^{-1}$ at a wavelength of 1600 nm; a first electrode in electrical communication with the layer of hydrogen-doped, single-crystalline germanium; and a second electrode in electrical communication with the layer of hydrogen-doped, single-crystalline germanium.

An embodiment of a method of using a photodetector, of the types described herein, to convert an optical signal into a electrical signal comprises: illuminating the layer of hydrogen-doped, single-crystalline germanium with radiation having wavelengths in the near infrared region of the electromagnetic spectrum, thereby generating electron-hole pairs in the hydrogen-doped, single-crystalline germanium; and applying an electric field to the layer of hydrogen-doped, single-crystalline germanium, wherein the electrons are transported to the first electrode and the holes are transported to the second electrode, thereby generating an electrical current.

An embodiment of a method of making a photodetector comprises: forming a layer of single-crystalline germanium on a substrate; subsequently doping the single-crystalline germanium with hydrogen ions; forming a first electrode in electrical communication with the layer of single-crystalline germanium; and forming a second electrode in electrical communication with the layer of single-crystalline germanium.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 11A depicts the measured I-V characteristics from a MSM photodetector fabricated on a non-annealed GeOI. FIG. 11B shows the measured responsivity spectra of the MSM Ge NM-based photodetectors using the non-annealed (NA) and annealed (A) GeOI wafers at a wavelength range of 1.5~1.64 μm with a wavelength step of 50 nm.

DETAILED DESCRIPTION

Photodetectors based on hydrogen-doped, single-crystalline germanium, including waveguide integrated photodetectors for photonic chip applications are provided.

Hydrogen doping provides the single-crystalline germanium with increased radiation absorption in the near infrared (NIR) region of the electromagnetic spectrum, including at wavelengths of 1550 nm and above. When the germanium photodetectors are integrated with silicon waveguides it is possible to operate the silicon waveguides at wavelengths above 1550 nm to reduce the absorption loss to the silicon.

Figure 1:
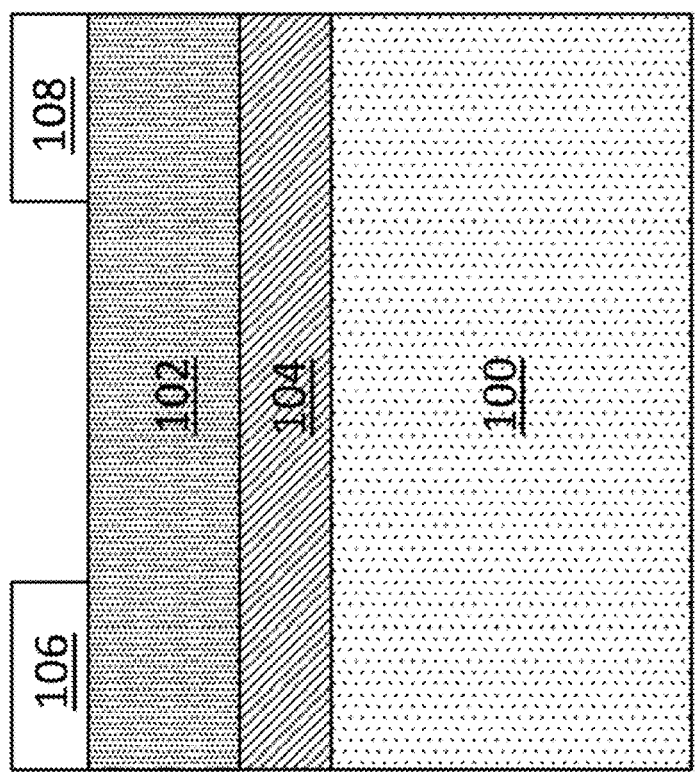
FIG. 1 is a schematic diagram of a metal-semiconductor-metal photodetector.

The photodetectors include metal-semiconductor-metal (MSM) photodetectors, one embodiment of which is depicted schematically in FIG. 1. This MSM photodetector includes a layer of hydrogen-doped (H+ doped), single-crystalline germanium (Ge) 102 over a handle substrate 100, such as a silicon wafer. An intervening layer of electrically insulating material 104, such as silicon dioxide, separates hydrogen-doped germanium 102 from handle substrate 100. When hydrogen-doped germanium 102 is illuminated with NIR radiation, electron-hole pairs are generated. Under the influence of an electric field applied to the hydrogen-doped, single-crystalline germanium via an external voltage source, the electrons and holes are separated and transported to a first electrode 106 and a second electrode 108, respectively. This results in a measurable electrical current, resulting in the conversion of the incident radiation (an optical signal) into an electric signal.

The photodetectors can be integrated with one or more optical waveguides, including silicon waveguides, for use in optical communications devices, such as photonic chips. In waveguide integrated photodetectors, the hydrogen-doped germanium is in optical communication with one or more optical waveguides. The hydrogen-doped germanium and an optical waveguide can be considered "in optical communication" if they are in sufficiently close proximity to one another, and arranged with respect to one another, such that when the photodetector is in operation, radiation exiting the waveguide is incident upon the hydrogen-doped germanium and creates photogenerated charge carriers.

Figure 2:
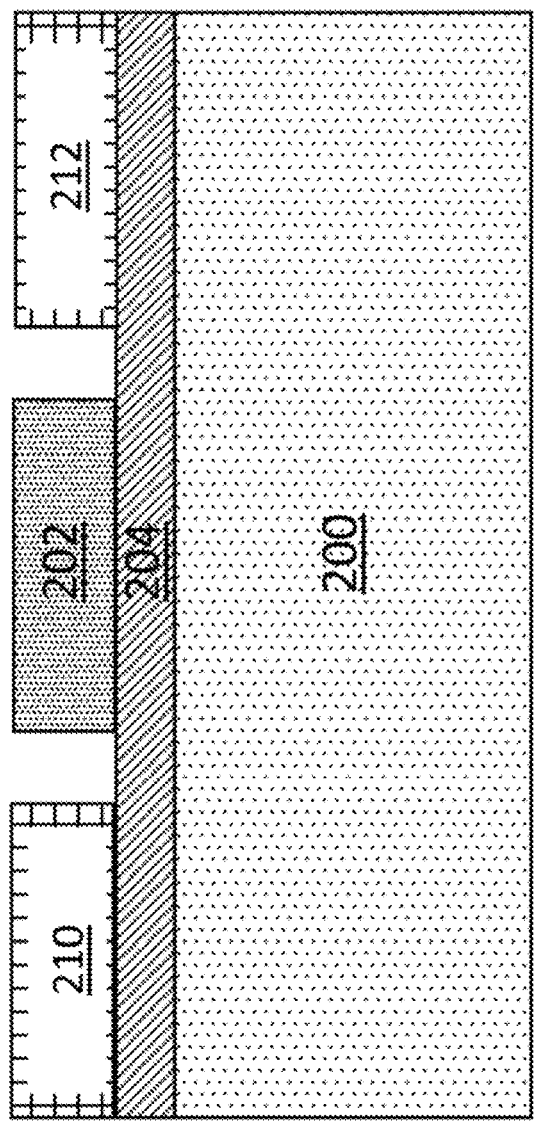
FIG. 2 is a schematic diagram of one embodiment of a waveguide integrated photodetector.

One embodiment of a waveguide integrated photodetector is shown schematically in FIG. 2. Like the photodetector of FIG. 1, this photodetector includes layer of hydrogen-doped, single-crystalline germanium 202 over a handle substrate 200, such as a silicon wafer. An intervening layer of electrically insulating material 204, such as silicon dioxide, separates hydrogen-doped germanium 202 from handle substrate 200. The waveguide integrated photodetector further includes a pair of in-plane optical waveguides 210, 212 adjacent to, and in optical communication with, layer of hydrogen-doped germanium 202.

Figure 3:
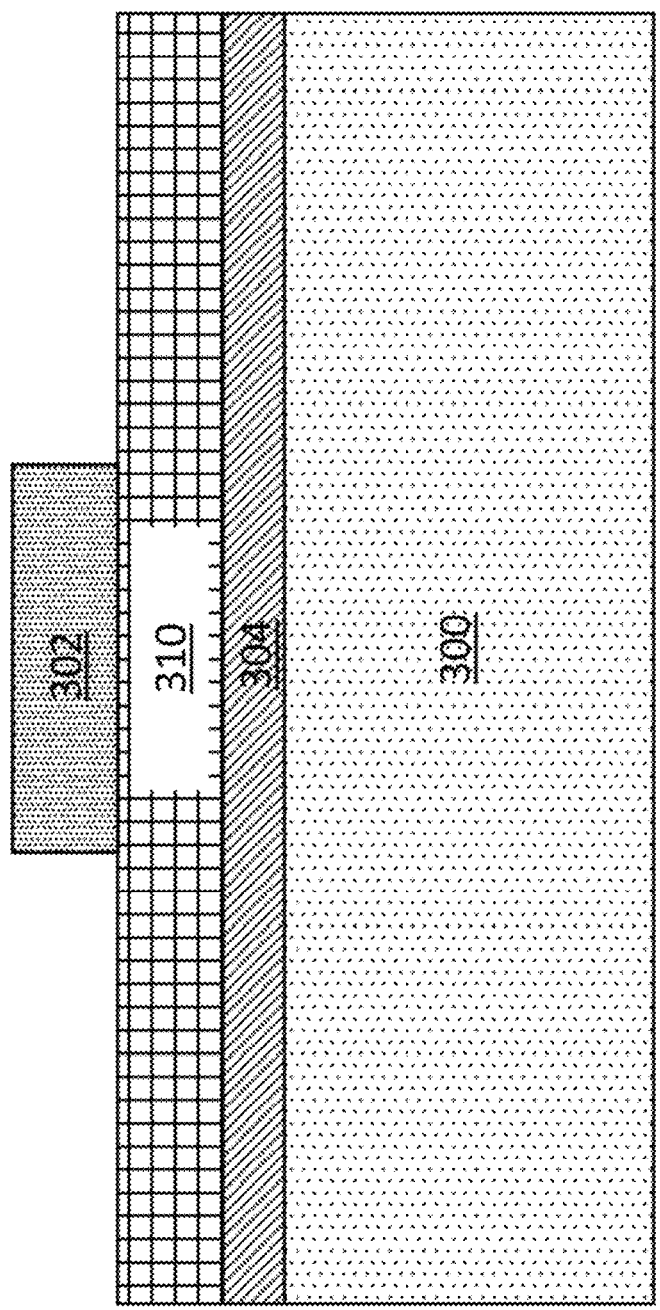
FIG. 3 is a schematic diagram of another embodiment of a waveguide integrated photodetector.

Another embodiment of a waveguide integrated photodetector is shown schematically in FIG. 3. Like the photodetector of FIG. 1, this photodetector includes layer of hydrogen-doped, single-crystalline germanium 302 over a handle substrate 300, such as a silicon wafer. An intervening layer of electrically insulating material 304, such as silicon dioxide, separates hydrogen-doped germanium 302 from handle substrate 300. The waveguide integrated photodetector further includes an optical waveguide 310 underlying, and in optical communication with, the layer of hydrogen-doped germanium 302.

Figure 4:
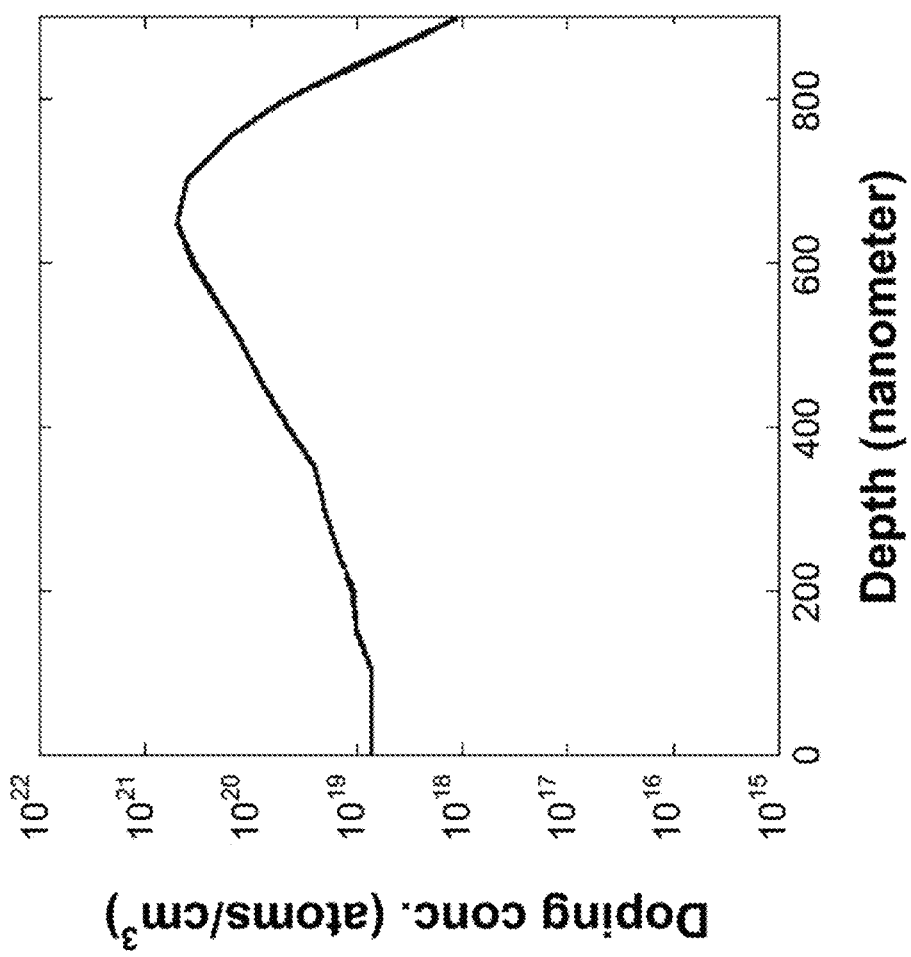
FIG. 4 is a graph of the hydrogen concentration profile in a germanium layer after hydrogen ion implantation.

The hydrogen dopants can be introduced into the germanium via hydrogen ion implantation, as discussed in more detail below. The concentration of implanted hydrogen ions should be sufficiently high to achieve enhanced light absorption at wavelengths of 1550 nm and higher and, more desirably at wavelengths of at least 1600 nm and higher. By way of illustration, some embodiments of the hydrogen-doped, single-crystalline germanium have a hydrogen concentration of at least $1 \times 10^{18}$ atoms/cm$^3$. This includes hydrogen-doped, single-crystalline germanium having a hydrogen concentration of at least $1 \times 10^{19}$ atoms/cm$^3$ and further includes hydrogen-doped, single-crystalline germanium having a hydrogen concentration of at least $1 \times 10^{20}$ atoms/cm$^3$. For example, the layer of hydrogen-doped, single-crystalline germanium may have a hydrogen concentration in the range from $1 \times 10^{18}$ atoms/cm$^3$ to $1 \times 10^{21}$ atoms/cm$^3$ throughout its thickness. However, the layer of germanium need not have a uniform concentration of hydrogen dopants throughout its thickness, since hydrogen ion implantation can result in a non-uniform, peaked distribution of the hydrogen dopants with the germanium layer. Thus, the above-recited germanium dopant concentrations can correspond to the hydrogen dopant concentration throughout the thickness of the hydrogen-doped germanium layer or to the hydrogen dopant concentration at some depth range within the layer. This is illustrated schematically in FIG. 4, which shows a graph of the hydrogen concentration profile in a germanium layer after hydrogen ion implantation using a hydrogen dose of $1 \times 10^{17}$ cm$^{-2}$ and an energy of 100 keV. The graph is based on a simulation using Stopping and Range of Ions in Matter (SRIM). The layer of hydrogen-doped germanium in the graph has a minimum hydrogen dopant concentration greater than $1 \times 10^{18}$ atoms/cm$^{-3}$ throughout its thickness and also achieves a hydrogen dopant concentration of greater than $1 \times 10^{19}$ atoms/cm$^{-3}$ over a more limited range of depths.

As a result of the hydrogen doping, the germanium layer has an improved photoresponse at wavelengths of 1550 nm and higher, relative to a layer of germanium having the same dimensions, but lacking the hydrogen dopants. In some embodiments, an enhanced photoresponse is achieved even at wavelengths of 1600 nm and higher (for example, at wavelengths in the range from 1600 nm to 1640 nm). The enhanced photoresponse is reflected in a higher absorption coefficient for the doped germanium relative to its undoped counterpart. For example, some embodiments of the hydrogen-doped germanium have an absorption coefficient of at least 100 cm$^{-1}$ at a wavelength of 1600 nm. This includes embodiments of the hydrogen-doped germanium having an absorption coefficient of at least 150 cm$^{-1}$, of at least 200 cm$^{-1}$, and at least 220 cm$^{-1}$, at a wavelength of 1600 nm. (Methods for determining the absorption coefficient of a layer of hydrogen-doped germanium are described in the Example.) The increased absorption coefficients correspond to measurable absorbances at wavelengths of 1600 and higher, even for very thin layers of the hydrogen-doped germanium. By way of illustration only, embodiments of the layers of hydrogen-doped germanium with a thickness in the range from about 400 nm to 500 nm are able to absorb at least 0.8% of the incident radiation at a wavelength of 1600 nm at room temperature (~23° C.). However, thicknesses outside of this range can be used. For example, some embodiments of the layers of hydrogen-doped germanium have a thickness in the range from about 100 nm to 2 μm, including layers of hydrogen-doped germanium having a thickness in the range from about 300 nm to 1 μm.

The photodetectors may further include reflective elements configured to provide multiple pass detection by the hydrogen-doped, single-crystalline germanium layer. Such elements include backside metal reflectors and distributed Bragg reflectors (DBRs). In addition, the photoresponse can be further enhanced by applying a tensile strain to the hydrogen-doped, single-crystalline germanium layer.

Figure 5:
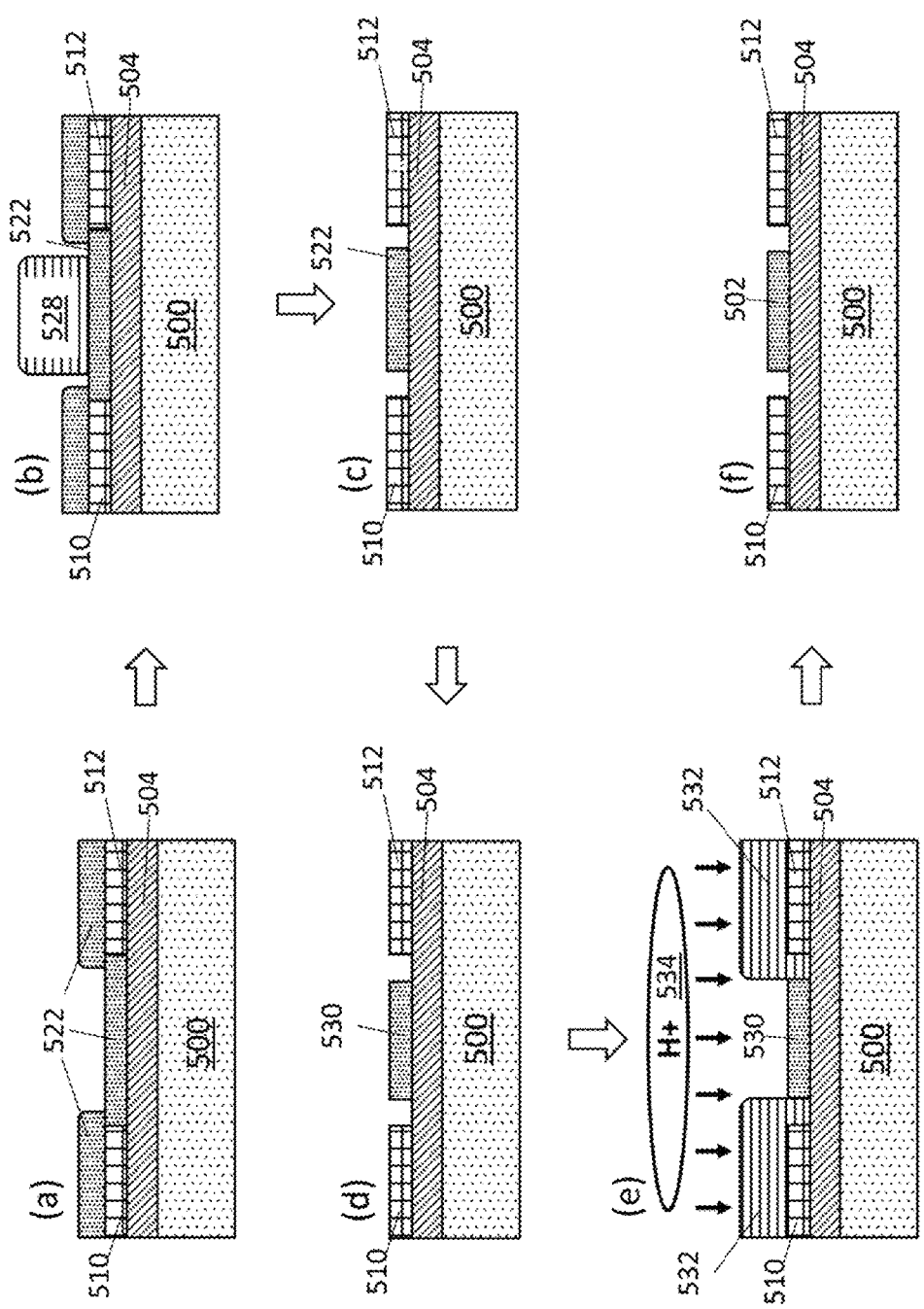
FIG. 5 shows a processing scheme for the fabrication of the waveguide integrated photodetector of FIG. 2.

A method of fabricating the photodetector of FIG. 2 is illustrated schematically in FIG. 5. As shown in panel (a) of FIG. 5, the process can be carried out by depositing a layer of amorphous germanium 522 over a semiconductor-on-insulator substrate, such as a silicon-on-insulator (SOI), 520 that includes a handle substrate 500, a thin insulating oxide layer (e.g., SiO$_2$) 504, and a thin single-crystalline semiconductor (e.g., Si) layer. Prior to the deposition of amorphous germanium 522, optical waveguides 510, 512 are patterned into the single-crystalline semiconductor layer. A portion of the amorphous germanium 522 on insulating oxide layer 504 and between optical waveguides 510, 512 is then protected with a layer of photoresist 528 (panel (b)). The exposed amorphous germanium 522, and then the photoresist 528, are subsequently removed by, for example, chemical etching (panel (c)). The remaining amorphous germanium 522 is then crystallized to provide a layer of single-crystalline germanium 530 between optical waveguides 510, 512 (panel (d)). Optical waveguides 510, 512 are then protected with another layer of photoresist 532 and hydrogen ions 534 are implanted into single-crystalline germanium 530 (panel (e)). Hydrogen ion implantation may create defects in the crystalline germanium. Nevertheless, the resulting germanium will still be substantially single-crystalline and can be considered single-crystalline for the purposes of this disclosure. Photoresist 532 is then removed, leaving a photodetector that includes a hydrogen-doped, single-crystalline germanium layer 502 (panel (f)). Although not shown in FIG. 5, a pair of electrodes can subsequently be formed on hydrogen-doped, single-crystalline germanium layer 502.

Figure 6:
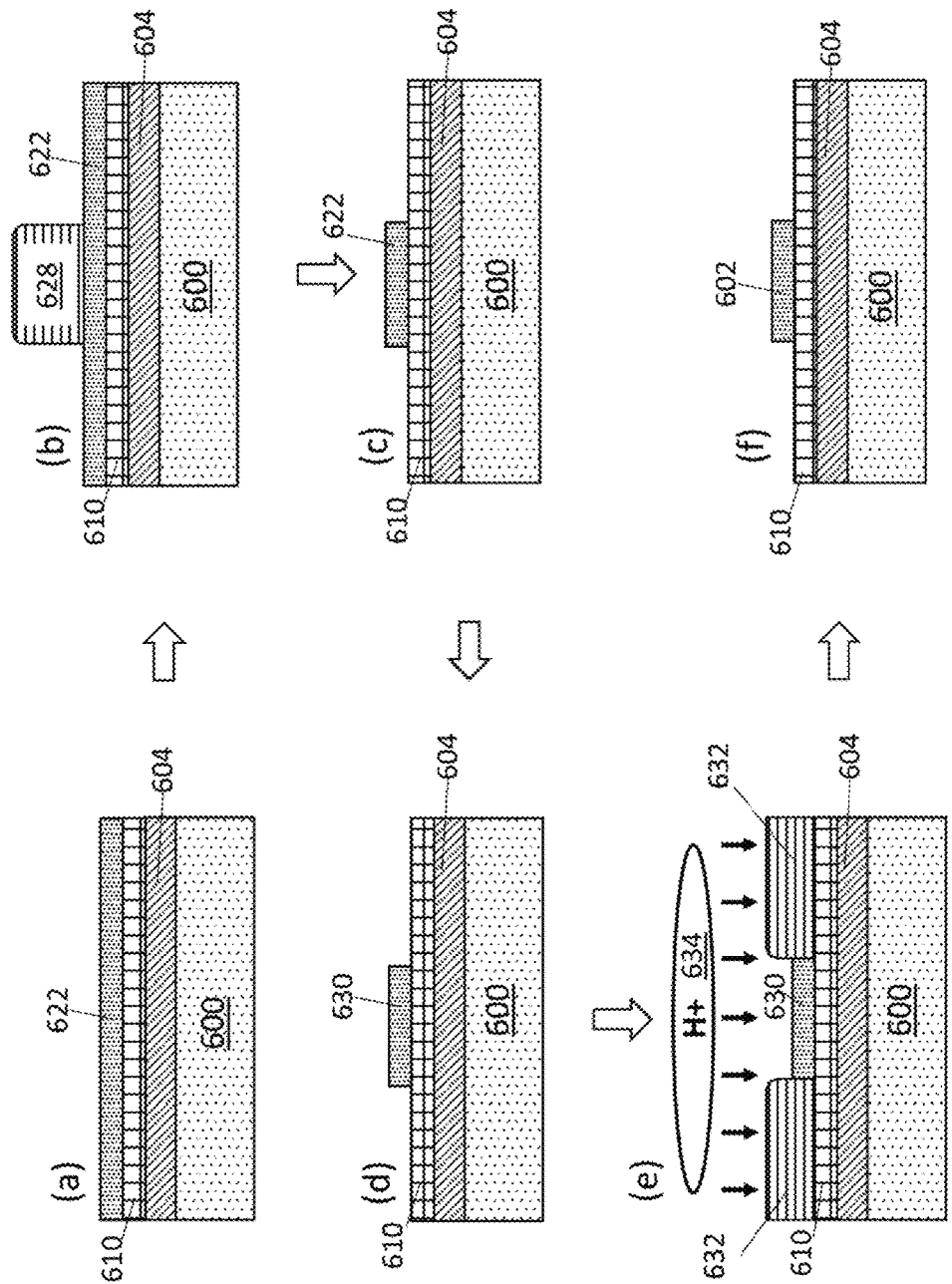
FIG. 6 shows a processing scheme for the fabrication of the waveguide integrated photodetector of FIG. 3.

A method of fabricating the photodetector of FIG. 3 is illustrated schematically in FIG. 6. As shown in panel (a) of FIG. 6, the process can being by depositing a layer of amorphous germanium 622 over a semiconductor-on-insulator substrate, such as a silicon-on-insulator (SOI), 620 that includes a handle substrate 600, a thin insulating oxide layer (e.g., SiO$_2$) 604, and a single-crystalline semiconductor (e.g., Si) layer 610. A portion of the amorphous germanium 622 on semiconductor layer 610 is then protected with a layer of photoresist 628 (panel (b)). The exposed amorphous germanium 622, and then photoresist 628, are subsequently removed by, for example, chemical etching (panel (c)). The remaining amorphous germanium 622 is then crystallized to provide a layer of single-crystalline germanium 630 on semiconductor layer 610 (panel (d)). The exposed portions of semiconductor layer 624 are then protected with another layer of photoresist 632 and hydrogen ions 634 are implanted into single-crystalline germanium 630 (panel (e)). Photoresist 632 is then removed, leaving a photodetector that includes a hydrogen-doped, single-crystalline germanium layer 602 above an optical waveguide provided by semiconductor layer 610 (panel (f)). Although not shown in FIG. 6, a pair of electrodes can subsequently be formed on hydrogen-doped, single-crystalline germanium layer 602.

A tensile strain can be applied to the layer of hydrogen-doped germanium by, for example, growing the layer of germanium on top of silicon, which has a different lattice constant and coefficient of thermal expansion than germanium, or by fabricating the photodetector on a flexible substrate and bending the photodetector, including the hydrogen-doped germanium layer to induce a tensile strain. By way of illustration, descriptions of inducing a tensile strain in germanium can be found in Liu et al., Appl. Phys. Lett., 87, 011110 (2005); and Kim et al., Appl. Phys. Lett., 109, 051105 (2016).

Because a post-implantation heat treatment, such a thermal anneal, would significantly reduce the concentration of hydrogen in the germanium, post-implantation high temperature processing steps should be avoided after the hydrogen implantation. Alternatively, if a post-implantation heat treatment step is desired, the heating should be carried out at a low temperature. For example, any heat treatment should be carried out at temperatures lower than those used in Smart Cut processes for cleaving thin layers from a bulk semiconductor substrate.

EXAMPLE

This example illustrates the concept of hydrogen-doping a layer of germanium to realize enhanced photoresponse at wavelengths beyond 1550 nm. Although, an anneal step was used as part of a Smart Cut process in the example, this step can be avoided using the alternative methods for forming a hydrogen-doped, single-crystalline layer illustrated in FIG. 5 and FIG. 6.

In this example, a thorough analysis of light absorption of the Ge NM associated with H ion implantation is reported. The optical properties of H-implanted Ge layer in GeOI wafers were characterized and it was found that the refractive index and the extinction coefficient could be manipulated by H implantation. The enhanced light absorption of H implanted Ge was further confirmed by investigating the responsivity of metal-semiconductor-metal (MSM) photodetectors that were fabricated using the Hl-implanted Ge NM.

Experiment

Figure 7:
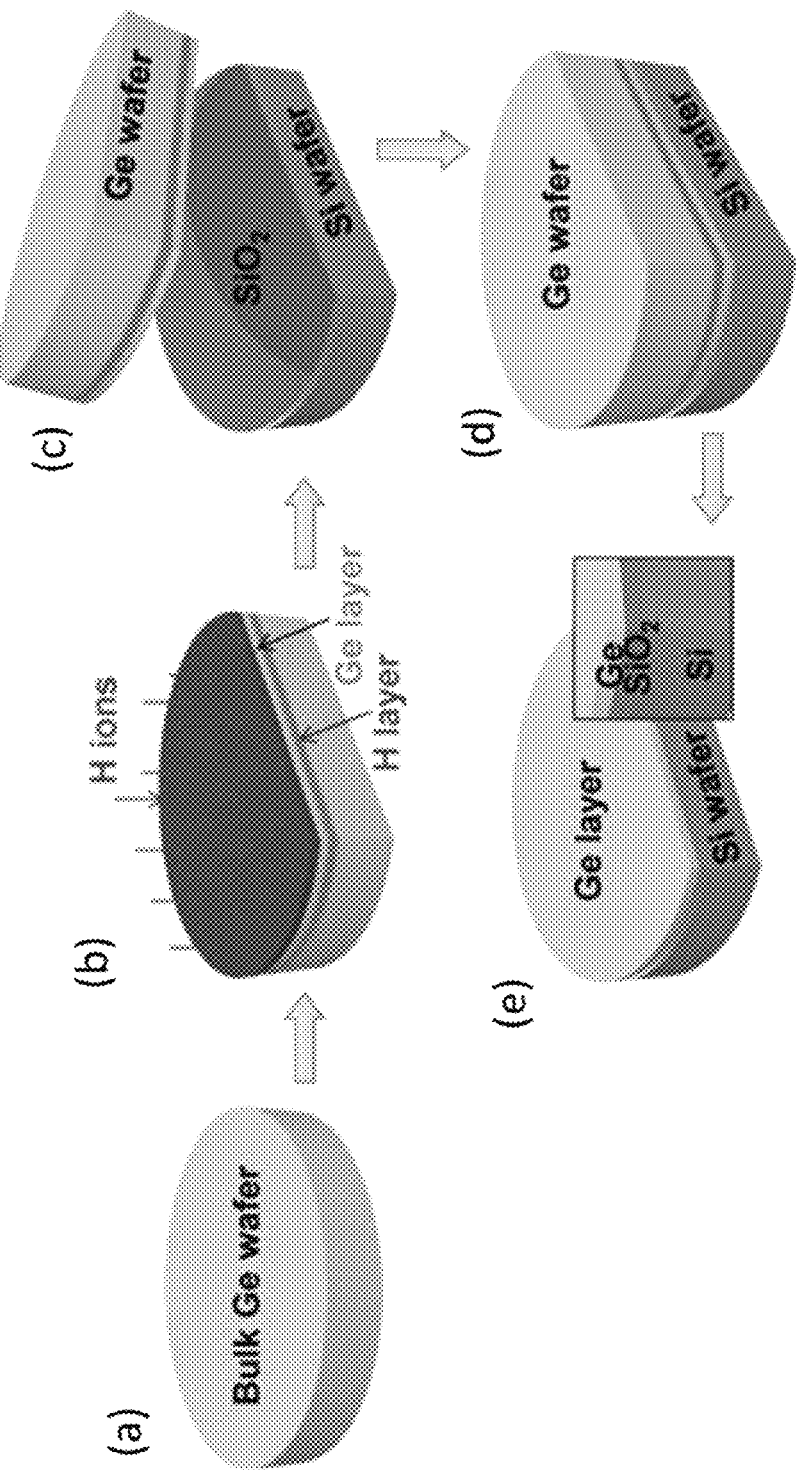
FIG. 7 shows a processing scheme for the fabrication of a germanium-on-insulator (GeOI) wafer, as described in the Example: panel (a) Cleaning a bulk Go wafer, panel (b) Depositing a 100 nm thick SiO$_2$ layer on top of the Ge wafer, followed by hydrogen implantation; panel (c) Wafer bonding to a thermally oxidized Si handling wafer; panel (d) Annealing the bonded wafers for splitting the Go layers by hydrogen exfoliation; and panel (e) Polishing a transferred Ge layer to the desired thickness to achieve a smooth surface roughness.

FIG. 7 shows the fabrication process flow of the GeOI wafers. The process began with an unintentionally doped 4-inch intrinsic bulk Ge wafer with a resistivity larger than 40 Ω-cm [FIG. 7, panel (a)]. A 100 nm thick plasma enhanced chemical vapor deposition (PECVD) SiO$_2$ layer was deposited on the Ge wafers as a screen oxide in order to obtain a uniform ion implantation profile. The oxide-capped Ge wafers were implanted by H+ ions with a dose of 1×10$^{17}$ cm$^{-2}$ and an energy of 100 keV [FIG. 7, panel (b)]. The peak position of the hydrogen implantation profile was carefully designed to be placed at 700 nm from the Ge surface in order to acquire a 400 nm thick Ge layer after the splitting process. A 200 nm thick SiO$_2$ was grown on an Si handling substrate as the buried oxide (BOX) layer for the final structure of the GeOI. Prior to the wafer bonding between the H implanted Ge wafers and the oxidized Si substrate, the PECVD $SiO_2$ was removed from the Ge substrate using concentrated hydrofluoric acid (HF, 49%), and an oxygen plasma activation process on a $SiO_2$/Si substrate was carried out to enhance the bonding strength. The wafer bonding process was performed using a direct wafer bonder (EV 801) under a vacuum of $7\times10^{-5}$ mbar [FIG. 7, panel (c)]. After finishing physical contact between the H implanted Ge wafer and the $SiO_2$/Si wafer in the wafer bonder, a careful temperature control during the annealing step with a ramp up/down of 1° C./min was applied to avoid fracturing the bonded wafers due to their different coefficients of thermal expansion. In addition to the annealing process in the wafer bonder, a two-step, low temperature annealing at 200° C. and 250° C. were carried out in a nitrogen-filled oven to improve the nucleation of hydrogen platelets to achieve a complete separation of the Ge layer from the Ge bulk substrate [FIG. 7, panels (d) and (e)]. A ~700 nm thick Ge layer with the rough surface facing up was successfully transferred onto the $SiO_2$/Si handling wafer without any visible voids. The rough Ge surface, which has a root mean square (RMS) value ($R_q$) of 22 nm, was polished down to 0.5 nm, giving a final Ge thickness of about 400 nm [FIG. 7, panel (e)].

To investigate the effect of thermal annealing on the electrical and optical properties of the Ge layer, the finished GeOI wafer was annealed using rapid thermal annealing (RTA) at 600° C. for 3 minutes in a nitrogen ambient. Transfer length measurements (TLM) were carried out on as-fabricated, non-annealed (NA) and annealed (A) GeOI wafers with three different thicknesses of Ge layers (400, 175, and 50 nm, respectively) to quantify the free-carrier concentrations inside the Ge layer.

To characterize the optical properties of the Ge layer of the GeOI wafer, the Ge layer was released from the GeOI wafer and transferred onto a transparent plastic substrate. The detailed process can be found in K. Zhang, J.-H. Seo, W. Zhou, and Z. Ma, "Fast flexible electronics using transferable silicon nanomembranes," J. Phys. D: Appl. Phys. 45(14), 143001-143015 (2012). In short, the top Ge layer was patterned and undercut in HF (49%) solution to remove the BOX layer. The released top GO layer, now called the GO NM, was flip-transferred onto a 1 μm thick adhesive layer (Microchem, SU-8 2002) coated on 180 μm thick polyethylene terephthalate (PET) film. Transferred Ge NMs (size: 5×5 $mm^2$) were completely glued to the PET films by a UV curing process. The Ge NM reflection and transmission spectra were measured at room temperature. A light source (Ocean Optics, HL-2000) was used and the light went through the fiber, collimator, aperture, and ×4 objective lens. Both the reflection and the transmission were measured from surface normal incidence over a spectral range of 1000~1600 nm. The spectra were collected simultaneously using two fiber coupling adapters that were connected to an optical spectrum analyzer (Yokogawa, AQ6370B).

Finally, MSM photodetectors were fabricated on non-annealed and annealed GeOI wafers to illustrate the improved photo responsivity of the H incorporated Ge layer. Interdigitated metal electrodes (Ti/Au=50/450 nm) with a 2 μm width and a 6 μm distance between the electrodes were e-beam evaporated on the 40×70 $\mu m^2$ patterned Ge layer, followed by the deposition of a 250 nm thick PECVD $SiO_2$ layer and the opening of the contact windows. I-V characteristics of the fabricated devices were measured using a semiconductor parameter analyzer (HP4155B) under dark and illuminated conditions. Infrared light at wavelengths of 1.5, 1.55, 1.6, and 1.64 μm was focused on the device via a lensed fiber with incident powers of 70, 125, 180, and 200 μW, respectively.

Results and Discussion

Figure 8A:
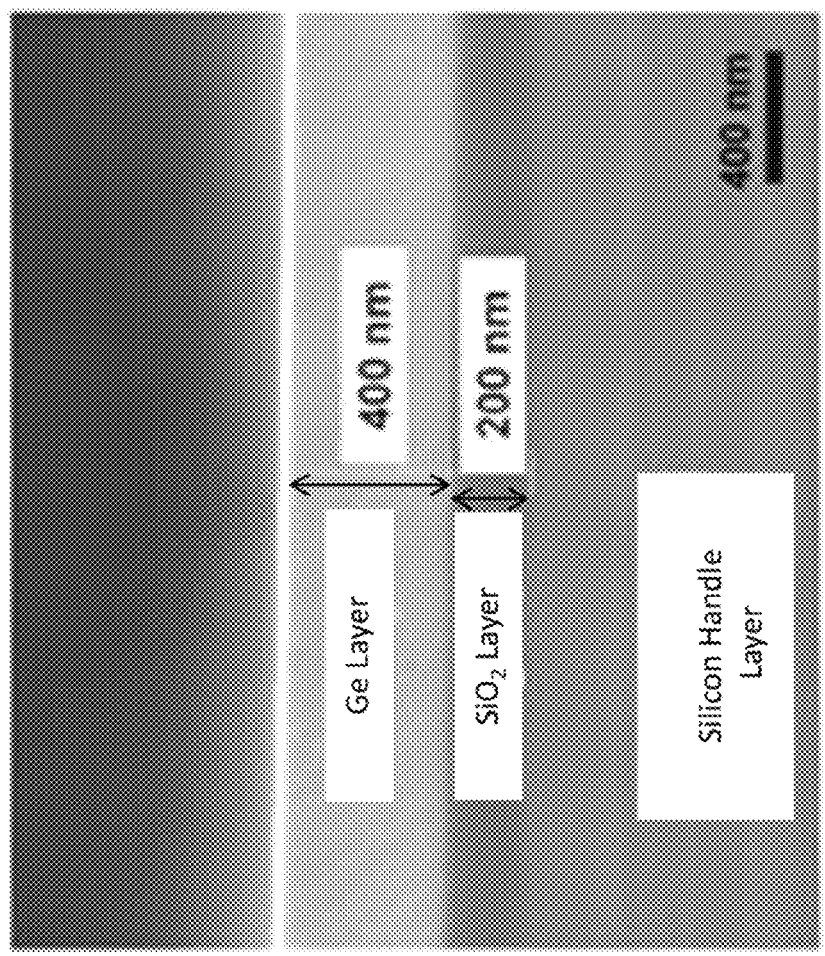
FIG. 8A depicts a cross-sectional scanning electron microscope (SEM) image of a GeOI wafer.

FIG. 8(A) shows a cross-sectional scanning electron microscopy (SEM) image of a finished 4-inch GeOI wafer, for which the buried interfaces after annealing at 250° C. for 1 hour and the subsequent CMP process were applied. The thicknesses of the Ge layer and the BOX layer were measured to be 400 and 200 nm, respectively. These values corresponded well with the target layer thicknesses.

Figure 8C:
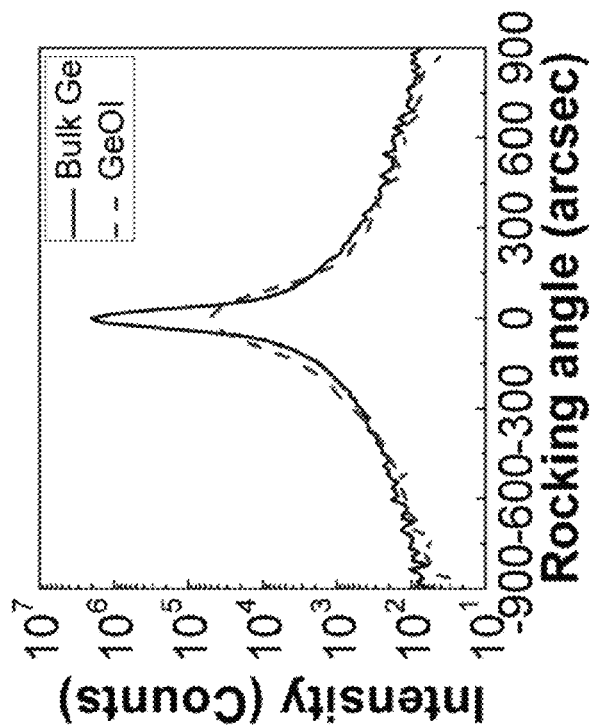
FIG. 8C shows high-resolution, x-ray diffraction (HR-XRD) rocking curves of the bulk Ge and the GeOI.
Figure 8B:
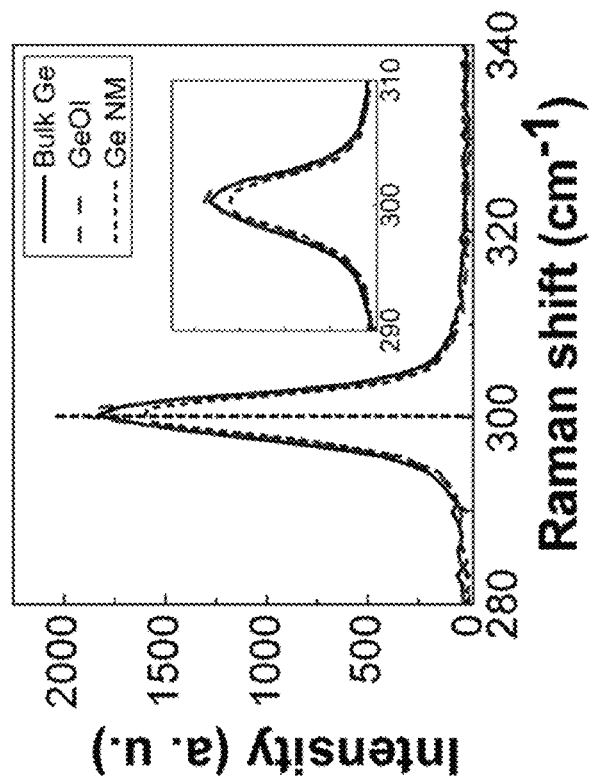
FIG. 8B depicts the measured Raman spectra from a bulk Ge wafer, a GeOI wafer, and a germanium nanomembrane (Ge NM) on a polyethylene terephthalate (PET) substrate.

It is important to note the crystallinity and the residual strain of the Ge layer in the fabricated GeOI wafer, since the process for the GeOI wafer fabrication involves several steps of thermal processes with high pressure. Horiba LabRAM ARAMIS Raman spectroscopy with a green laser (532 nm) was used to investigate the material properties from the top surface of the Ge layer. The spectral resolution was 0.01 $cm^{-1}$. FIG. 8(B) shows a comparison of the Raman spectrum taken from a bulk Ge wafer, the Ge layer in the fabricated GeOI wafer, and the as-transferred Ge NM on PET substrate, respectively. The bulk Ge wafer was used as the reference, which has a Ge—Ge characteristic peak at 300.29 $cm^{-1}$. The same 300.29 $cm^{-1}$ Ge—Ge characteristic peaks from other two cases (i.e., the Ge layer in GeOI wafer and as-transferred Ge NM on PET substrate) confirmed that no strain was introduced in the Ge layer of the GeOI wafer or in the released and transferred Ge NM. Full width at half maximum (FWHM) of the bulk Ge and GeOI was investigated using high resolution X-ray diffraction (HR-XRD, PANalytical X'Pert PRO XRD). Rocking curves of both samples were scanned around the (004) reflection as shown in FIG. 8(C). The FWHM of the bulk Ge was measured to be 43 arcsec, while it increased to 124 arcsec measured from the GeOI. The increased FWHM was probably caused by the structural defects associated with H ion implantation.

Figure 9B:
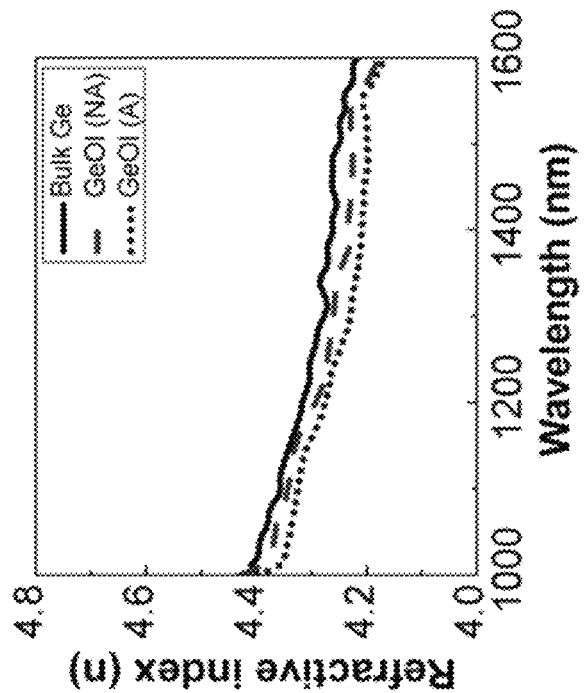
FIG. 9B presents the free-carrier concentration of a bulk Ge wafer for comparison.
Figure 9A:
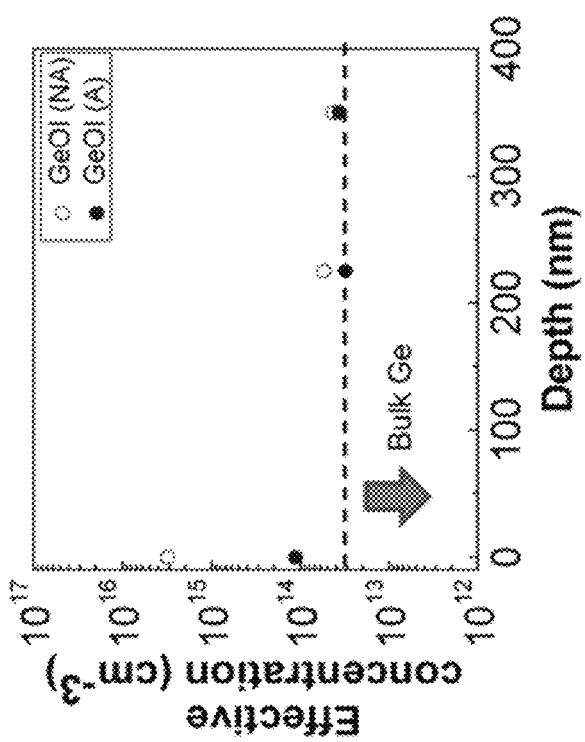
FIG. 9A depicts the measured free-carrier concentrations of the Ge layers of non-annealed (NA) and annealed (A) GeOI wafers at 600° C. for 3 minutes.

H implantation introduced high concentrations of vacancies in Ge. In addition, H implantation resulted in residual H+ ions remaining inside of the Ge layer of the GeOI wafer when the Ge layer was split from the bulk Ge wafer. The residual H+ ions combined with these Ge vacancies to form $V_2H$ with an acceptor energy level of 0.08 eV above the valence band of Ge. (S. J. Pearton, J. W. Corbett, and T. S. Shi, "Hydrogen in Crystalline Semiconductors," Appl. Phys. A 43(3), 135-195 (1987).) A comparison of the free-carrier (hole) concentration, extracted from the TLM measurement results, is shown in FIG. 9(A). The free-carrier concentration of the Ge layer of the non-annealed (NA) GeOI wafer showed the highest value of $3\times10^{15}$ $cm^{-3}$ at the top surface of the Ge layer of the GeOI, and was reduced to $5\times10^{13}$ and $4\times10^{13}$ $cm^{-3}$ at the depths of 225 nm and 350 nm, respectively. In contrast, the free-carrier concentration in the Ge layer of the annealed GeOI wafer ($1\times10^{14}$ $cm^{-3}$) was lower by approximately an order of magnitude near the Ge top surface, although the free-carrier concentration eventually reached similar values at the deeper regions. It should be noted that the measured free-carrier concentrations in the Ge layers of the GeOI wafers were greater than those of the bulk Ge wafer. The extra concentration of free carriers was ascribed to the electrically active acceptors that resulted from the residual H+. A higher free-carrier concentration near the top Ge surface (i.e., the deep regions of H implanted Ge wafer before splitting) of the GeOI wafer was observed, suggesting that the H distribution in the Ge layer was similar to the projected range ($R_p$) of the implanted H ions. A reduction of the free-carrier concentration could be largely attributed to recovered defects due to the thermal annealing.

Figure 9C:
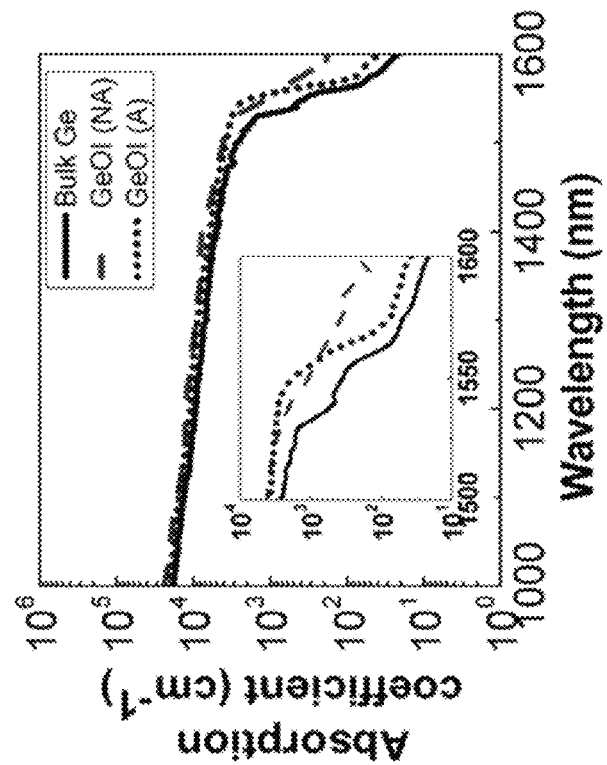
FIG. 9C depicts the measured refractive indices and extinction coefficients of a bulk Ge wafer and the Ge layer of a GeOI wafer non-annealed and annealed samples over a wavelength range of 1000~1600 nm.
Figure 9D:
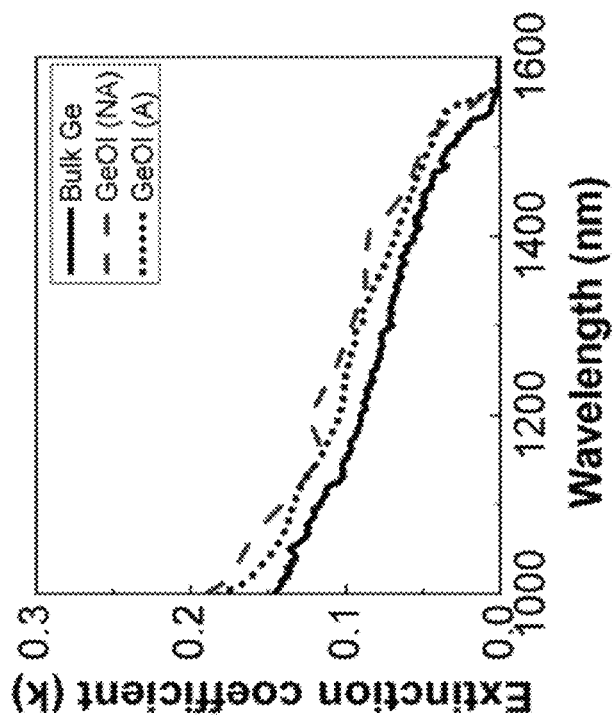
FIG. 9D shows the absorption coefficient (α) of a bulk Ge wafer and the Ge layer of a GeOI wafer calculated from the measured extinction coefficient (k) via $\alpha=4\pi k/\lambda$. The inset shows the magnified absorption coefficient spectra in a wavelength of 1500~1600 nm.

In order to evaluate the changes in the optical properties of an H-implanted Ge layer of the GeOI wafer, refractive indices and extinction coefficients of a bulk Ge wafer, as well as non-annealed and annealed GeOI wafers, were carefully investigated using an ellipsometer (J. A. Woollam M-2000 DI) at a wavelength range of 1000~1600 nm. FIGS. 9(B) and 9(C) show the refractive indices and extinction coefficients taken from the bulk Ge wafer, the non-annealed GeOI wafer, and the annealed GeOI wafer, respectively. The refractive index and extinction coefficient of the Ge film of the GeOI wafers were fitted by considering the measured refractive index and extinction coefficient of the BOX layer in a fitting model (WVASE®). The Ge layer of the non-annealed GeOI wafer exhibited a slightly decreased refractive index with a Δn of 0.024, and the refractive index of the annealed GeOI wafer further decreased with a Δn of 0.046, compared to the bulk Ge wafer. In contrast, the extinction coefficient of the non-annealed GeOI wafer increased, with a Δk of 0.027 compared to that of the bulk Ge wafer over the measured wavelength range. The extinction coefficient of the annealed GeOI wafer slightly decreased, with a Δk of 0.008 compared to that of the non-annealed GeOI wafer. This trend of decreased refractive index and increased extinction coefficient was ascribed to the defects introduced by H$^+$ implantation. It should be noted that the effect of increasing free-carrier concentration on the optical constants was negligibly small. The absorption coefficient (α) of the Ge layer was calculated using the equation:

$$\alpha = (4 \times \pi \times k)/\lambda, \quad (1)$$

where α is the absorption coefficient, k is the extinction coefficient, and λ is the wavelength. As shown in FIG. 9(D), the absorption coefficient of the GeOI wafer increased compared to that of the bulk Ge wafer. The non-annealed GeOI wafer showed a further enhanced absorption coefficient. The absorption enhancement was more significant at longer wavelengths than shorter ones. The absorption coefficients at 1600 nm increased from 22 cm$^{-1}$ or the bulk Ge wafer to 40 and 224 cm$^{-1}$ for the annealed and non-annealed GeOI wafers, respectively. Absorption coefficients for Ge on Si under biaxial tensile strain of approximately 500 and 900 cm$^{-1}$ at 1600 nm of 0.2 and 0.25%, respectively, have been reported. (J. Liu, D. D. Cannon, K. Wada, Y. Ishikawa, S. Jongthammanurak, D. T. Danielson, J. Michel, and L. C. Kimerling, "Tensile strained Ge photodetectors on Si platform for C and L band telecommunications," Appl. Phys. Lett. 87(1), 011110-011112 (2005).) It should be noted that Raman spectroscopy confirmed that the improvement in the absorption coefficient was not related to the tensile strain effect. Therefore, the absorption coefficient could be further improved with the application of tensile strain.

To further verify the light absorption of the Ge NM, reflection and transmission measurements were performed on SU-8/PET and Ge NM/SU-8/PET stacks. The Ge NM (released) from the annealed GeOI wafer was used in this experiment. The size of the transferred Ge NM (i.e., 5×5 mm$^2$) was made larger than spot size of an incident light. The thicknesses of the Ge NM, SU-8, and PET were measured using a profilometer to be 0.4, 1, and 180 μm, respectively. Reflection and transmission spectra of the reference SU-8/PET structure were measured to be approximately 9.8% and 86% in average at the wavelengths of 1000~1600 nm, respectively. In theory, the absorption (A) in the Ge layer can be calculated using the equation:

$$A = 1 - R - T \quad (2)$$

where R and T refer to reflection and transmission, respectively. (E. D. Capron and O. L. Brill, "Absorption Coefficient as a Function of Resistance for Optical Germanium at 10.6 μm," Appl. Opt. 12(3), 569-572 (1973).) The calculated absorption of 4.2% of the SU8/PET stack was not the ideal value, because absorption in the SU-8/PET stack was negligible, considering that the extinction coefficients of the SU-8 and PET are nearly zero in the near IR wavelength range. The possible, but negligible, measurement error could be from the scattering loss at the surface caused by non-ideal surface normal incidence.

Figure 10A:
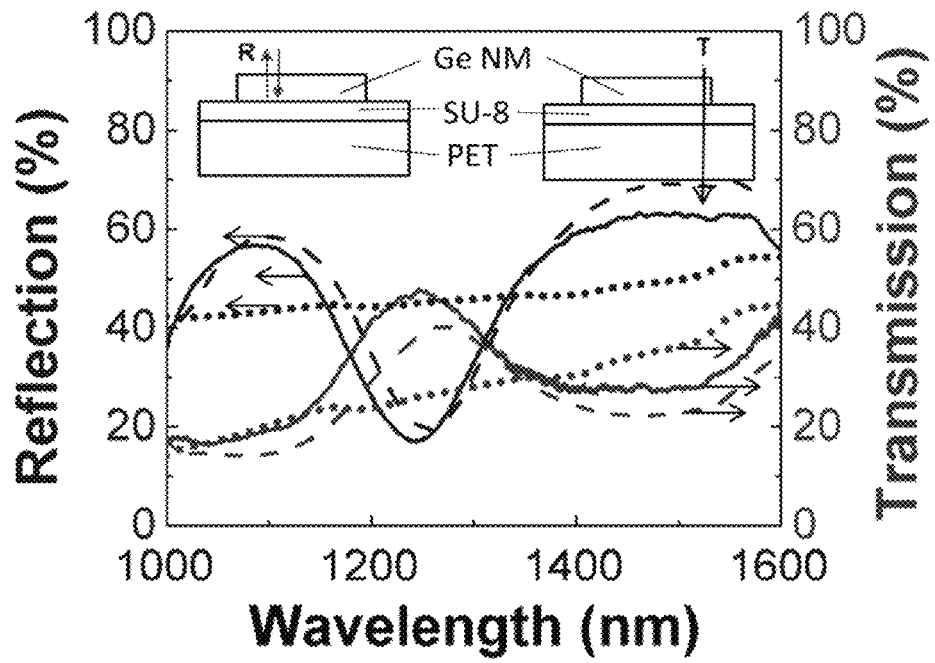
FIG. 10A shows reflection and transmission spectra at a wavelength range of 1000~1600 nm. Note that the measured (solid line) and simulated (dashed line) spectra were obtained from a Ge NM/SU-8/PET structure and calculated (dotted line) spectra came from a Ge NM.
Figure 10B:
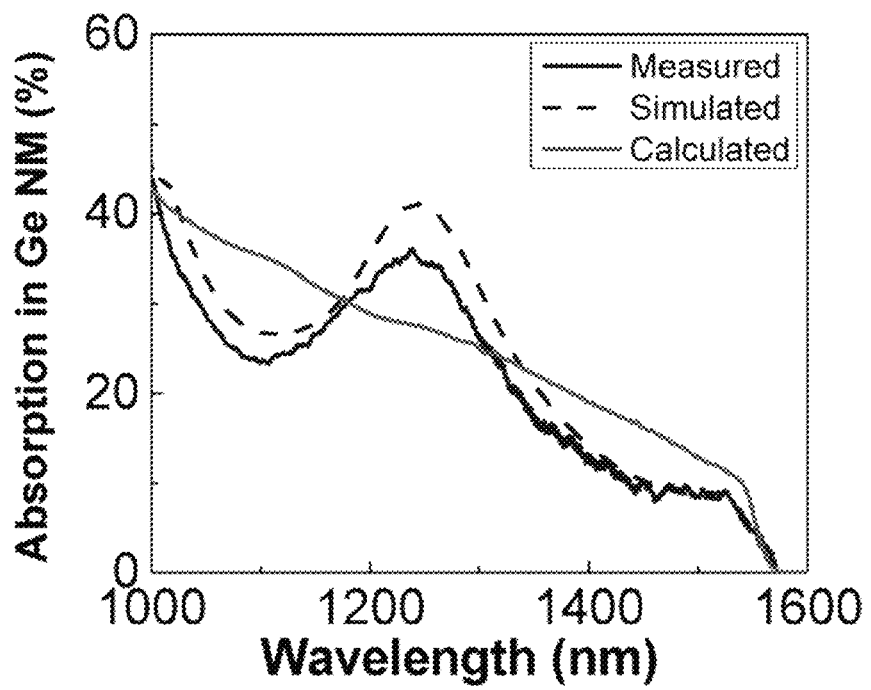
FIG. 10B depicts measured, simulated, and calculated absorption spectra of the Ge NM.

FIG. 10(A) shows the reflection and transmission spectra of the Ge NM/SU-8/PET stack. The reflection was measured to be approximately 60% in the near IR range, except for the sharp drop near 1250 nm. Such optical characteristics can be ascribed to the Fabry-Perot oscillation due to the finite thickness of PET substrate. To accurately extract the absorption of the Ge NM from the measured reflection and transmission of the Ge NM/SU-8/PET stack, the following equation can be derived by considering the measurement error.

$$A_{Ge\ NM} = 1 - R_{Ge\ NM/SU-8/PET} - T_{Ge\ NM/SU-8/PET} - T_{Ge\ NM} \times E_{SU-8/PET} \quad (3)$$

where A is the absorption, R is the reflection, T is the transmission, and E is the measurement error. The measurement error (i.e., $E_{SU-8/PET}$) used in Eq. (3) refers to the value measured from the SU-8/PET stack. In the case of the Ge NM/SU-8/PET stack, the light that reaches the interface of the Ge NM and SU-8/PET will be $T_{GeNM}$, which should be incorporated in Eq. (3). To obtain the absorption ($A_{Ge\ NM}$) of the Ge NM, absorption of SU-8/PET should be subtracted from $A_{Ge\ NM/SU-8/PET}(1-R_{Ge\ NM/SU-8/PET}-T_{Ge\ NM/SU-8/PET})$. Since the transmitted light ($T_{Ge\ NM}$) through the Ge NM is absorbed in the SU-8/PET, the absorption of the SU-8/PET can be calculated from $T_{Ge\ NM} \times A_{SU-8/PET}(E_{SU-8/PET})$. Therefore, the absorption of the Ge NM can be calculated from the Eq. (3). FIG. 10(B) shows the absorption spectrum of the Ge NM obtained by Eq. (3) in the wavelength range of 1000~1600 nm. The absorption gradually decreased from 44% at 1000 nm to 9% at 1526 nm, except for an abrupt increase of approximately 36% near 1240 nm. The absorption decreased sharply to 0% at 1572 nm, which agreed well with the measured extinction coefficient of Ge NM. The absorption coefficient of the annealed Ge NM was calculated to be 105 cm$^{-1}$ at 1570 nm, and the penetration depth was calculated to be 95 μm. There was no absorption at wavelengths larger than 1570 nm, which can be explained by the thinness (400 nm) and penetration depth of the Ge NM.

Figure 10C:
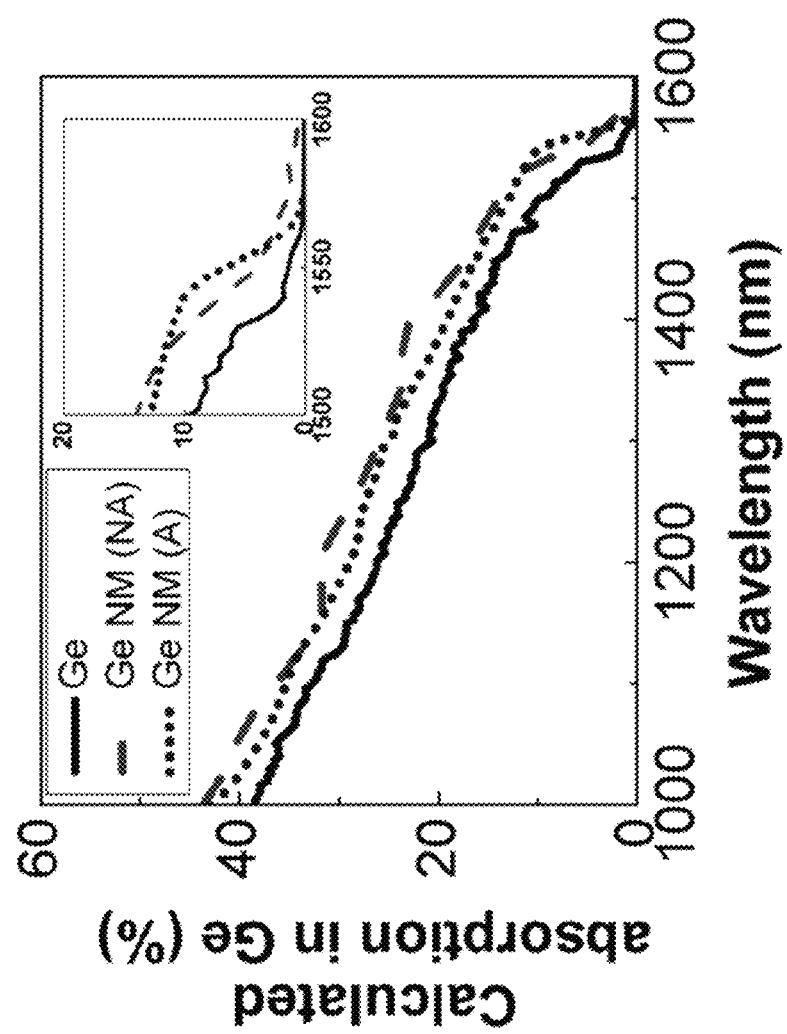
FIG. 10C shows a comparison of the calculated absorption spectra from the Ge (not implanted) and Ge layer of a GeOI wafer. Note that the same thickness of 400 nm was used. Inset shows magnified absorption spectra in a wavelength of 1500~1600 nm.

To further compare the experimentally obtained spectra with theory and simulation, we obtained each spectrum using the following equations. Because the Ge NM is optically thin and polished, multiple reflections should be considered. The reflection, absorption, and transmission of the Ge NM were calculated numerically using the following equations (P. W. Kruse, L. D. McGlauchlin, and R. B. McQuistan, *Elements of Infrared Technology* (John Wiley & Sons, 1962)):

$$r = [(n-1)^2 + k^2]/[(n+1)^2 + k^2] \quad (4)$$

$$R = r + [(1-r)^2 r e^{-2\alpha t}/(1-r^2 e^{-2\alpha t})] \quad (5)$$

$$A = [(1-r)(1-e^{-\alpha t})/(1-r e^{-\alpha t})] \quad (6)$$

$$T = 1 - R - A \quad (7)$$

where r is reflectivity, n is the refractive index, k is the extinction coefficient, α is the absorption coefficient, and t is the thickness. All parameters used in the calculation were the measured values. Besides the numerical calculation, a simulation was carried out using three-dimensional finite-difference time-domain (FDTD) software (Lumerical FDTD) to simulate the T, R, and A spectra. A vertically stacked structure of Ge NM/SU-8/PET, with thicknesses of 0.4, 1, and 180 µm, was used. Optical constants of the SU-8 and PET were taken from literature (J. L. Digaum J. J. Pazos, J. Chiles, J. D'Archangel, G. Padilla, A. Tatulian, R. C. Rumpf, S. Fathpour, G. D. Boreman, and S. M. Kuebler, "Tight control of light beams in photonic crystals with spatially-variant lattice orientation," Opt. Express 22(21), 25788-25804 (2014): J. F. Elman, J. Greener. C. M. Herzinger, and B. Jobs, "Characterization of biaxially-stretched plastic films by generalized ellipsometry," THIN SOLID FILMS 313-314(2), 814-818 (1998)), while the optical constants of the Ge NM were based on the experimental data. The SU-8 and PET were assumed to be lossless in the simulation. As shown in FIGS. 10(B) and 10(C), good qualitative agreement was obtained among the measured, calculated, and simulated plots. It should be noted that an interference contrast was observed in the experimental data due to multiple reflections inside the Ge NM/SU-8/PET stack.

FIG. 10(C) shows comparative absorption spectra of the Ge (not H implanted), non-annealed, and annealed Ge NM in the same wavelength range. The absorption of Ge with the same thickness of 400 nm was calculated using the optical constants measured by the ellipsometer. The inset of FIG. 10(C) shows magnified spectra in the wavelength of 1500~1600 nm. It was observed that the absorptions of the non-annealed and annealed Ge NMs were slightly improved compared to that the absorptions of the Ge across the measured wavelength. Zero absorption occurred at 1578 nm and beyond in the case of the Ge and the annealed Ge NM. However, the absorption of the non-annealed Ge NM extended to a longer wavelength, close to 1600 nm. In particular, the non-annealed Ge NM showed 0.8% of the absorption even at 1600 nm.

MSM Ge NM-based photodetectors were fabricated using non-annealed and annealed GeOI wafers. FIG. 11(A) shows the measured I-V characteristics of MSM photodetectors fabricated on the non-annealed GeOI under various wavelengths. FIG. 11(B) shows a comparison of typical responsivity spectra of the photodetectors at 2 V bias. Responsivity of the device with non-annealed Ge NM was constantly higher than that of the device with annealed Ge NM under near IR illumination, except for that at 1550 nm. The responsivity at 1600 and 1640 nm increased from 0.023 A/W and 0.013 A/W to 0.048 A/W and 0.036 A/W, respectively. The enhanced responsivity of non-annealed cases at 1500, 1600, 1640 nm was consistent with the absorption spectra of the Ge NM as shown in FIG. 10(C). Responsivity can be improved using a thicker Ge layer. Reflection techniques such as a distributed Bragg reflector (DBR) and a back-side metal reflector can further enhance the responsivity. It should be noted that the measured dark current of the device with the non-annealed Ge NM was 6.95 pA, which was higher than the annealed case (4.84 pA) at 2 V bias. This agreed well with the larger free-carrier concentration of the non-annealed Ge NM since the free carriers contribute to electrical conductivity. Overall, the improved photo-responsivity of the Ge photodetector may be attributed to enhanced absorption in the Ge NM due to H ion implantation.

Conclusion

This example demonstrates that the use of H ion implantation can enhance light absorption in Ge to extend its useful wavelength range for photon detection. The refractive index of the Ge layer of the GeOI wafer after H$^+$ ion implantation decreased with a Δn of 0.024, while the extinction coefficient increased with a Δk of 0.027 compared to those of the bulk Ge wafer at the wavelength range of 1000-1600 nm, respectively. Although annealing further decreased the refractive index with an additional Δn of 0.022, it slightly decreased the extinction coefficient, having a Δk of 0.008 compared to that of the Ge layer of non-annealed GeOI wafer. Based on the measured optical constants, the absorption coefficient of the non-annealed GeOI wafer was calculated to be 224 cm$^{-1}$ at 1600 nm, 10 times larger than that of the bulk Ge wafer (i.e., 22 cm$^{-1}$), and about 5 times larger than that of the annealed GeOI wafer (i.e., 40 cm$^{-1}$). The enhanced light absorption of H implanted Ge was further characterized on transferred Ge NMs on PET substrates. Absorption of the bulk Ge wafer and annealed Ge NM with the same thickness of 400 nm dropped to zero at 1578 nm, whereas the absorption wavelength of the non-annealed Ge NM was extended over 1600 nm. The measured responsivity spectra of Ge photodetectors exhibited the same behavior as the absorption spectra of the Ge NMs.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A photodetector comprising:
    a layer of hydrogen-doped, single-crystalline germanium having a hydrogen dopant concentration of at least $1 \times 10^{18}$ atoms/cm$^3$ throughout its thickness;
    a first electrode in electrical communication with the layer of hydrogen-doped, single-crystalline germanium; and
    a second electrode in electrical communication with the layer of hydrogen-doped, single-crystalline germanium.

2. The photodetector of claim 1, wherein at least a portion of the layer of hydrogen-doped, single-crystalline germanium has a hydrogen dopant concentration of at least $1 \times 10^{19}$ atoms/cm$^3$.

3. The photodetector of claim 1, wherein at least a portion of the layer of hydrogen-doped, single-crystalline germanium has a hydrogen dopant concentration of at least $1 \times 10^{20}$ atoms/cm$^3$.

4. The photodetector of claim 1, wherein the layer of hydrogen-doped, single-crystalline layer has an absorption coefficient of at least 100 cm$^{-1}$ at a wavelength of 1600 nm.

5. The photodetector of claim 1, wherein the layer of hydrogen-doped, single-crystalline layer has an absorption coefficient of at least 220 cm$^{-1}$ at a wavelength of 1600 nm.

6. The photodetector of claim 1, further comprising an optical waveguide in optical communication with the layer of hydrogen-doped, single-crystalline germanium.

7. The photodetector of claim 6, wherein the optical waveguide is a silicon waveguide.

8. The photodetector of claim 1, wherein the layer of hydrogen-doped,
single-crystalline germanium is tensilely strained.

9. A photodetector comprising:
a layer of hydrogen-doped, single-crystalline germanium having an absorption coefficient of at least 100 cm$^{-1}$ at a wavelength of 1600 nm;
a first electrode in electrical communication with the layer of hydrogen-doped, single-crystalline germanium; and
a second electrode in electrical communication with the layer of hydrogen-doped, single-crystalline germanium.

10. The photodetector of claim 9, wherein the layer of hydrogen-doped,
single-crystalline germanium has an absorption coefficient of at least 220 cm$^{-1}$ at a wavelength of 1600 nm.

11. The photodetector of claim 9, wherein the layer of hydrogen-doped,
single-crystalline germanium has an absorption coefficient in the range from 100 cm$^{-1}$ to 250 cm$^{-1}$ at a wavelength of 1600 nm.

12. The photodetector of claim 9, further comprising an optical waveguide in optical communication with the layer of hydrogen-doped, single-crystalline germanium.

13. The photodetector of claim 12, wherein the optical waveguide is a silicon waveguide.

14. The photodetector of claim 9, wherein the layer of hydrogen-doped,
single-crystalline germanium is tensilely strained.

15. A method for converting an optical signal into an electrical signal using a photodetector comprising:
a layer of hydrogen-doped, single-crystalline germanium having a hydrogen dopant concentration of at least 1×10$^{18}$ atoms/cm$^3$ throughout its thickness;
a first electrode in electrical communication with the layer of hydrogen-doped, single-crystalline germanium; and
a second electrode in electrical communication with the layer of hydrogen-doped, single-crystalline germanium, the method comprising illuminating the layer of hydrogen-doped, single-crystalline germanium with radiation having wavelengths in the near infrared region of the electromagnetic spectrum, thereby generating electron-hole pairs in the hydrogen-doped, single-crystalline germanium; and
applying an electric field to the layer of hydrogen-doped, single-crystalline germanium, wherein the electrons are transported to the first electrode and the holes are transported to the second electrode, thereby generating an electrical current.

16. The method of claim 15, wherein the radiation having wavelengths in the near infrared region of the electromagnetic spectrum is emitted from a silicon waveguide.

17. A method for converting an optical signal into an electrical signal using a photodetector comprising:
a layer of hydrogen-doped, single-crystalline germanium having an absorption coefficient of at least 100 cm$^{-1}$ at a wavelength of 1600 nm;
a first electrode in electrical communication with the layer of hydrogen-doped, single-crystalline germanium; and
a second electrode in electrical communication with the layer of hydrogen-doped, single-crystalline germanium, the method comprising illuminating the layer of hydrogen-doped, single-crystalline germanium with radiation having wavelengths in the near infrared region of the electromagnetic spectrum, thereby generating electron-hole pairs in the hydrogen-doped, single-crystalline germanium; and
applying an electric field to the layer of hydrogen-doped, single-crystalline germanium, wherein the electrons are transported to the first electrode and the holes are transported to the second electrode, thereby generating an electrical current.

18. The method of claim 17, wherein the radiation having wavelengths in the near infrared region of the electromagnetic spectrum is emitted from a silicon waveguide.

19. A method of making a photodetector, the method comprising:
forming a layer of single-crystalline germanium on a substrate;
subsequently doping the single-crystalline germanium with hydrogen ions;
forming a first electrode in electrical communication with the layer of single-crystalline germanium; and
forming a second electrode in electrical communication with the layer of single-crystalline germanium.

20. The method of claim 19, wherein doping the single-crystalline germanium with hydrogen ions provides the layer of single-crystalline germanium with a hydrogen dopant concentration of at least 1×10$^{18}$ atoms/cm$^3$ throughout its thickness.

21. The method of claim 19, wherein doping the single-crystalline germanium with hydrogen ions provides the layer of hydrogen-doped, single-crystalline germanium with an absorption coefficient of at least 100 cm$^{-1}$ at a wavelength of 1600 nm.

22. The method of claim 19, wherein forming a layer of single-crystalline germanium on a substrate comprises forming a layer of amorphous germanium on a substrate and crystallizing the layer of amorphous germanium.

* * * * *